US010079286B2

(12) United States Patent
Edwards et al.

(10) Patent No.: US 10,079,286 B2
(45) Date of Patent: Sep. 18, 2018

(54) TRANSISTOR WITH QUANTUM POINT CONTACT

(71) Applicant: Texas Instruments Incorporated, Dallas, TX (US)

(72) Inventors: Henry Litzmann Edwards, Garland, TX (US); Greg Charles Baldwin, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/472,438

(22) Filed: Mar. 29, 2017

(65) Prior Publication Data

US 2017/0200796 A1    Jul. 13, 2017

Related U.S. Application Data

(63) Continuation of application No. 14/725,869, filed on May 29, 2015, now Pat. No. 9,659,934.

(Continued)

(51) Int. Cl.
*H01L 29/06* (2006.01)
*H01L 29/417* (2006.01)
(Continued)

(52) U.S. Cl.
CPC ...... *H01L 29/41758* (2013.01); *H01L 21/266* (2013.01); *H01L 21/26513* (2013.01);
(Continued)

(58) Field of Classification Search
CPC ........... H01L 29/0847; H01L 29/42376; H01L 29/7833; H01L 29/7836; H01L 29/775;
(Continued)

(56) References Cited

U.S. PATENT DOCUMENTS 6,069,380 A * 5/2000 Chou ............... B82Y 10/00
257/315
7,683,364 B2 3/2010 Edwards et al.
(Continued)

OTHER PUBLICATIONS

Yano et al., Single-Electron-Memory Integrated Circuit for Giga-to-Tera But Storage—ISSCC96 conference, Session 16, Technology Directions: Memory, Paper FP 16.4 (Feb. 1996).*

(Continued)

*Primary Examiner* — Jami V Miller
(74) *Attorney, Agent, or Firm* — Rose Alyssa Keagy; Charles A. Brill; Frank D. Cimino

(57) ABSTRACT

Methods and apparatus for quantum point contacts. In an arrangement, a quantum point contact device includes at least one well region in a portion of a semiconductor substrate and doped to a first conductivity type; a gate structure disposed on a surface of the semiconductor substrate; the gate structure further comprising a quantum point contact formed in a constricted area, the constricted area having a width and a length arranged so that a maximum dimension is less than a predetermined distance equal to about 35 nanometers; a drain/source region in the well region doped to a second conductivity type opposite the first conductivity type; a source/drain region in the well region doped to the second conductivity type; a first and second lightly doped drain region in the at least one well region. Additional methods and apparatus are disclosed.

20 Claims, 12 Drawing Sheets

Related U.S. Application Data

(60) Provisional application No. 62/005,574, filed on May 30, 2014.

(51) Int. Cl.

| | | |
|---|---|---|
| *H01L 29/423* | (2006.01) | |
| *H01L 29/08* | (2006.01) | |
| *H01L 29/78* | (2006.01) | |
| *H01L 21/266* | (2006.01) | |
| *H01L 29/66* | (2006.01) | |
| *H01L 29/45* | (2006.01) | |
| *H01L 27/088* | (2006.01) | |
| *H01L 21/8234* | (2006.01) | |
| *H01L 21/265* | (2006.01) | |

(52) U.S. Cl.
CPC .... *H01L 21/823475* (2013.01); *H01L 27/088* (2013.01); *H01L 29/0847* (2013.01); *H01L 29/42376* (2013.01); *H01L 29/456* (2013.01); *H01L 29/665* (2013.01); *H01L 29/66575* (2013.01); *H01L 29/7833* (2013.01)

(58) Field of Classification Search
CPC . H01L 29/1033; H01L 29/125; H01L 29/127; H01L 29/7391; H01L 29/41758; B82Y 10/00
USPC .................. 257/9, 20; 977/937, 938; 438/20
See application file for complete search history.

(56) References Cited

U.S. PATENT DOCUMENTS

| | | |
|---|---|---|
| 7,910,918 B2 | 3/2011 | Edwards et al. |
| 7,994,009 B2 | 8/2011 | Benaissa et al. |
| 8,026,507 B2 | 9/2011 | Chatterjee et al. |
| 8,362,462 B2 | 1/2013 | Edwards et al. |
| 9,000,505 B2 | 4/2015 | Edwards et al. |
| 9,659,934 B2 * | 5/2017 | Edwards ............... H01L 27/092 |
| 2007/0200156 A1 | 8/2007 | Wunderlich et al. |
| 2010/0045365 A1 | 2/2010 | Chatterjee et al. |
| 2012/0098590 A1 | 4/2012 | Edwards et al. |

OTHER PUBLICATIONS

Montgomery et al., "Plasma Kinetic Theory", Mc Graw-Hill 1964, p. 31.*

Tang, Y.S., G. Jin; J. H. Davies, J. G. Williamson and C. D. W. Wilkinson, Quantized conductance in a long silicon inversion wire, Physical Review B, Jun. 15, 1992-I, pp. 1379-13802, vol. 45, No. 23, The American Physical Society.

Van Houten, Henk and Carlo Beenakker. "Quantum Point Contacts: the quantization of ballistic electron transport through a constriction demonstrates that conduction is transmission." Physics Today 49.7 (Jul. 1996): 22.

Ishikuro et al., (Energy Spectrum of the Quantum-Dot in a Si Single-Electron Device,1997 55th Annual Device Research Conference Digest May 1997, pp. 84-85.

Saitoh et al., "Room-Temperature Operation of Current Switching Circuit Using Integrated Silicon Single-Hot Transistors", Japanese Journal of Applied Physics, vol. 44, No. 11, Feb. 2005 (pp. L338-L341).

* cited by examiner

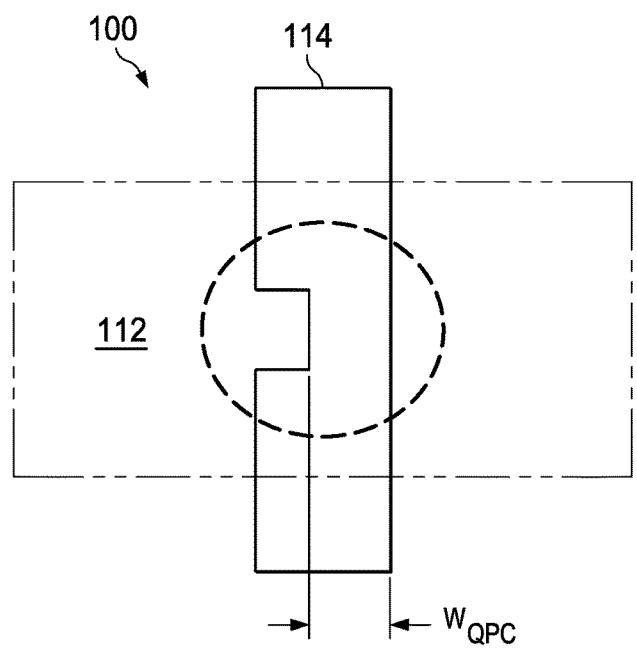
FIG. 1
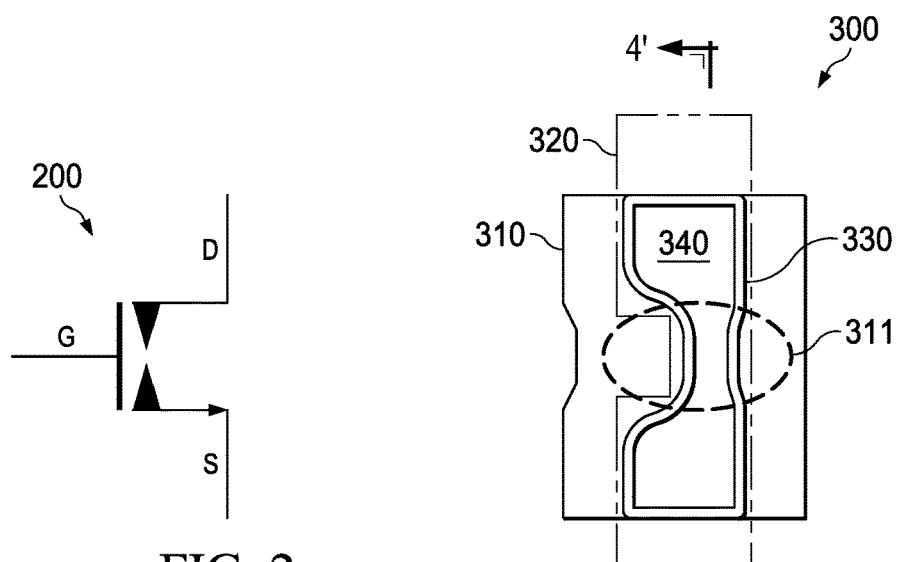
FIG. 2
FIG. 3

TRANSISTOR WITH QUANTUM POINT CONTACT

CROSS-REFERENCE TO RELATED APPLICATIONS

Under 35 U.S.C. § 120, this continuation application claims benefits of and priority to U.S. patent application Ser. No. 14/725,869 (TI-67846), filed on May 29, 2015, which under 35 U.S.C. § 119(e), claims priority to U.S. Provisional Patent Application Ser. No. 62/005,574 (TI-67486PS), filed May 30, 2014. The entirety of the above referenced applications are hereby incorporated herein by reference.

TECHNICAL FIELD

The arrangements of the present application relate generally to semiconductor processing and in particular to structures and methods compatible with MOS semiconductor processes for forming quantum point contacts.

BACKGROUND

Many circuits commonly used in commercial integrated circuits require known resistor values to serve as references to enable accuracy in the circuit function. Example applications for accurate components include oscillators, amplifiers, voltage regulators, current mirrors, current sources, op-amps with feedback, etc. Current techniques for obtaining resistors with known values include screening resistor values, using resistor deltas, using either mechanical or electrical trimming of resistors in a post-production process, and the like. Example applications include tuning and phase locking operations in communications circuitry, current sources, current mirrors, bias currents, and other applications using resistance.

Most resistors produced in semiconductor processes in known prior approaches have an inherent dependence on temperature, and resistors produced in semiconductor processing also depend on process variations. Example resistors include polysilicon resistors and N well resistors formed from N-type doped semiconductor material. These resistors have values that vary with temperature and with process variations. Many techniques have been developed to modify the physical devices to reduce or compensate for temperature variation so the resistors can be used for a reference value or to generate a current from a voltage, for example. However, none of these is available to be incorporated into a practical integrated circuit. The need for accurate voltage and current sources leads to the fabrication of complex circuitry to overcome the prior art resistor temperature and process variations. A "PTAT" (proportional to absolute temperature) circuit can be used in a ratio or divider circuit, with current mirrors and feedback amplifiers for example, to attempt to remove the temperature dependence from a current or voltage. A common circuit is a bandgap reference circuit for producing a reference voltage independent of these variations. A resistor can be used to produce a current from the voltage output by a bandgap reference circuit. The output current is simply the reference voltage divided by the resistance. However, even if the resistance temperature dependence is compensated for by using a ratio or other operation to cancel out the temperature dependent factors, the process variations remain and there is no practical semiconductor process resistor available to date that is a fixed value over all expected process and temperature variations. For example, known prior resistors produced in semiconductor processes have value dependencies that vary with process steps such as lithography, deposition, and etching. The resistor values also depend on variable thin film properties such as film thickness, uniformity, and composition.

A known component with a conductivity value (the inverse of resistance value) that is a fixed quantity has been constructed using a quantum device. Quantum devices have been described in semiconductor processes at room temperature. For example, U.S. Patent Application Publication No. 2012/00098590, titled "Quantum Electro-Optical Device using CMOS Transistor with Reverse Polarity Drain Implant," with inventors Edwards et. al., published Apr. 26, 2012, which is co-owned with the present application and which is hereby incorporated by reference in its entirety herein, describes forming a quantum device using a CMOS semiconductor process. By creating a confinement quantum well of very small dimensions, e.g., between 5 and 15 nanometers, quantum operations can be achieved in semiconductor material.

A quantum point contact exhibiting quantized conductance in a GaAs substrate is described in a paper titled "Quantum Point Contacts—The quantization of ballistic electron transport through a constriction demonstrates that conduction is transmission", Physics Today, authored by Henk van Houten and Carlo Beenakker, July 1996, at p. 22. In this prior known approach, a heterojunction is formed between a GaAs substrate and AlGaAs material and a constriction point is formed beneath a gate terminal. A 2D electron gas is formed on either side of the constriction point. A gate conductor overlies the constriction point. When a constriction point for electron transport is similar in width to the Fermi wavelength for the electrons, a quantum point contact is formed. In the paper, conductance (I/V) was found for the quantum point contact that is quantized and proportional to the ratio $2e^2/h$, where e is the electron charge, and h is Planck's constant, inversely this forms a quantized resistance proportional to $h/2e^2$, or approximately $\frac{1}{13}$ kohms. This resistance has a value that depends only on physical constants and is not temperature or process dependent. A series of step values corresponding to quantized conductance controlled by a gate voltage is demonstrated in the paper at near zero temperatures. The conductance is proportional only to 2 physical constants and so an accurate and fixed value resistance or conductance component is possible.

A continuing need thus exists for fixed and stable value passive components such as resistors that can be formed within a current commercial MOS semiconductor process and which operate at room temperature and over commercially acceptable temperature ranges. By fabricating the resistor devices along with MOS devices such as transistors, capacitors, diodes and the like in a single integrated circuit device, control circuitry can be formed alongside and using the resistive devices, forming a commercially useful integrated circuit. Because the resistance will be accurate over temperature and process variations, the need for complex temperature compensation circuitry and other temperature compensated resistor circuits can be reduced or eliminated, saving silicon area and reducing the size and complexity of the integrated circuits.

SUMMARY

The arrangements that form various aspects of the present application provide a quantum point contact device that can be fabricated in a CMOS semiconductor process. The arrangements include methods and apparatus for providing quantum point contact devices by forming a constriction of a quantum dimension in a channel for conducting electrons in order to achieve a quantized conductance between a drain region and a source region. The quantum point contact device of the arrangements provides an accurate conductance or an accurate resistance that operates at room temperatures and which is compatible with the simultaneous fabrication of MOS transistors, enabling arrangements where the quantum point contact devices are formed along with MOS transistors on an integrated circuit.

In an example arrangement that forms an aspect of the present application, a quantum point contact device comprises a semiconductor substrate; at least one well region in a portion of the semiconductor substrate and doped to a first conductivity type; a gate structure disposed on a surface of the semiconductor substrate and overlying a channel region in the substrate, and further comprising a gate dielectric layer lying over the channel region and a gate conductor material overlying the gate dielectric; the gate structure further comprising a quantum point contact formed in a constricted area of the gate structure, the constricted area having a width and a length arranged so that a maximum dimension of the width and the length is less than a predetermined distance equal to about 35 nanometers; a drain/source region in the well region disposed spaced from one side of the channel region and doped to a second conductivity type opposite the first conductivity type; an source/drain region in the well region spaced from the channel region on a side opposite the drain/source region, the source/drain region doped to the second conductivity type; a first lightly doped drain region in the at least one well region and disposed between the drain/source region and the channel region; and a second lightly doped drain region in the at least one well region and disposed between the source/drain region and the channel region, the second lightly doped drain region.

In an example alternative arrangement that forms an aspect of the present application, a method for forming a quantum point contact device includes providing a semiconductor substrate; implanting impurities in the semiconductor substrate to form a well region doped to a first conductivity type; depositing a gate dielectric over a surface of the semiconductor substrate, depositing a gate conductor over the gate dielectric, and etching the gate conductor and the gate dielectric to form a gate structure overlying a channel region defined in a central portion of the well region, the gate structure further comprising a constricted area, the constricted area having a width and a length arranged so that a maximum dimension of the width and the length is less than a predetermined distance equal to about 35 nanometers; implanting impurities to dope the semiconductor substrate to form a first lightly doped drain region extending into the semiconductor substrate from the surface and disposed on one side of the channel region; implanting impurities to dope the semiconductor substrate to form a second lightly doped drain region extending into the semiconductor substrate from the surface on a side of the channel region opposite the first lightly doped drain region; implanting impurities to dope the semiconductor substrate to a second conductivity type to form a drain/source region extending from the surface of the semiconductor substrate deeper than the first lightly doped drain region, the drain/source region spaced from the channel region by a portion of the first lightly doped drain region; and implanting impurities to dope the semiconductor substrate to the second conductivity type to form an source/drain region extending from the surface into the semiconductor substrate deeper than the second lightly doped drain region, the source/drain region spaced from the channel region by a portion of the second lightly doped drain region.

In yet another arrangement that forms an additional aspect of the present application, an integrated circuit includes at least one quantum point contact device formed in a first well region in a semiconductor substrate that is doped to a first conductivity type, the quantum point contact device further comprising: a drain/source region in the first well region disposed spaced from one side of a channel region defined in a central portion of the well region, and doped to a second conductivity type opposite the first conductivity type; an source/drain region in the first well region spaced from the channel region on a side opposite the drain/source region, the source/drain region doped to the second conductivity type; a first lightly doped drain region in the first well region and disposed between the drain/source region and the channel region, the first lightly doped drain region doped to the second conductivity type; a second lightly doped drain region in the first well region and disposed between the source/drain region and the channel region, the second lightly doped drain region doped to the second conductivity type; and a gate structure disposed on a surface of the semiconductor substrate and overlying the channel region, the gate structure comprising a gate dielectric layer lying over the channel region and a gate conductor material overlying the gate dielectric, the gate structure further comprising a quantum point contact formed in a constricted area, the constricted area having a width and a length arranged so that a maximum dimension of the width and the length is less than a predetermined distance equal to about 35 nanometers; wherein the quantum point contact further comprises a current path in the substrate beneath the constricted area of the gate structure, the current path having a width of less than 20 nanometers; and at least one MOS transistor disposed in the first well region adjacent the quantum point contact device, and further comprising: a first source/drain region in the first well region disposed spaced from one side of a MOS channel region defined in a central portion of the first well region, and doped to a second conductivity type opposite the first conductivity type; a second source/drain region in the first well region disposed spaced from another side of the MOS channel region opposite the first source/drain region, the second source/drain region doped to the first conductivity type; a first MOS lightly doped drain region disposed between the first source/drain and the MOS channel region, the first MOS lightly doped drain region doped to the second conductivity type; a second MOS lightly doped drain region disposed between the second source/drain region and the MOS channel region, the second MOS lightly doped drain region doped to the second conductivity type; and a MOS gate structure disposed on a surface of the semiconductor substrate and overlying the channel region, the MOS gate structure comprising a gate dielectric layer lying over the channel region and a gate conductor material overlying the gate dielectric.

Recognition is made in the present application that a quantum point contact device can be fabricated in a MOS semiconductor process. The arrangements provide quantum point contact devices having an accurate conductance between a drain and a source terminal, the conductance being proportional to two physical constants and independent of temperature and process variations, thereby providing accurate resistance elements that are compatible with semiconductor processes for integration with transistors and other circuitry. Applications include amplifiers, analog and digital circuitry, reference current and bias current sources, and various circuitry applications where accurate value passive components are used or desired.

BRIEF DESCRIPTION OF THE DRAWINGS

For a more complete understanding of the illustrative examples of aspects of the present application that are described herein and the advantages thereof, reference is now made to the following descriptions taken in conjunction with the accompanying drawings, in which:

FIG. 1 depicts a plan view of a layout for an example quantum point contact arrangement forming an aspect of the present application;

FIG. 2 illustrates a schematic symbol for a quantum point contact resistor arrangement such as the one illustrated in FIG. 1;

FIG. 3 illustrates in a top view a portion of a region in a semiconductor substrate including various diffusion regions forming a quantum point contact arrangement;

Corresponding numerals and symbols in the different figures generally refer to corresponding parts unless otherwise indicated. The figures are drawn to clearly illustrate the relevant aspects of the illustrative example arrangements and are not necessarily drawn to scale.

DETAILED DESCRIPTION

Figure 4:
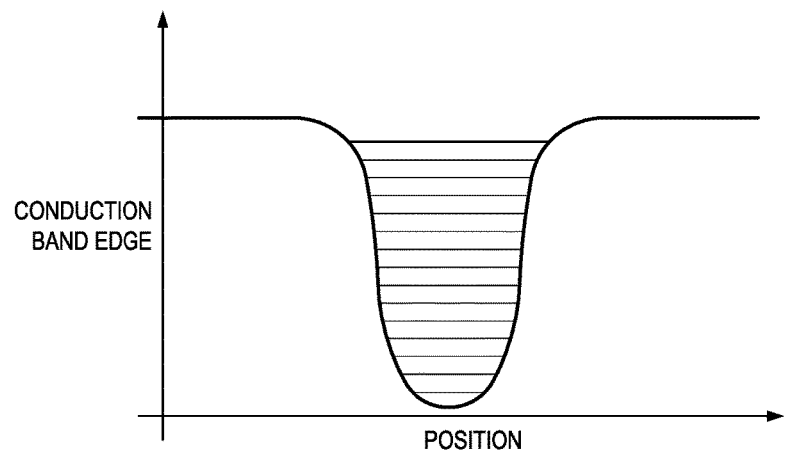
FIG. 4 is a graph of a potential diagram for a quantum point contact arrangement such as shown in FIG. 3.

The making and using of various example illustrative arrangements that incorporate aspects of the present application are discussed in detail below. It should be appreciated, however, that the illustrative examples disclosed provide many applicable inventive concepts that can be embodied in a wide variety of specific contexts. The specific examples and arrangements discussed are merely illustrative of specific ways to make and use the various arrangements, and the examples described do not limit the scope of the specification, nor do they limit the scope of the appended claims.

For example, when the term "coupled" is used herein to describe the relationships between elements, the term as used in the specification and the appended claims is to be interpreted broadly, and while the term "coupled" includes "connected", the term "coupled" is not to be limited to "connected" or "directly connected" but instead the term "coupled" may include connections made with intervening elements, and additional elements and various connections may be used between any elements that are described as "coupled."

FIG. 1 is a top view of a quantum point contact 100. In FIG. 1 an active area 112 is shown. Active area 112 is an area of a semiconductor substrate that can receive impurities to form doped regions. Overlying the active area 112 is a gate 114. The semiconductor substrate can be silicon, for example, which is typically used in manufacturing integrated circuits including MOS transistors, for example. Alternatively, gallium arsenide (GaAs) and other semiconductor substrate materials can be used. In addition, epitaxial layers over insulators (SOI) can be used instead of the semiconductor substrate. The gate 114 can be formed of a polysilicon, a doped polysilicon, or other conductive materials. The gate 114 can be replaced at a later process step with a metal gate, for example.

In FIG. 1, a notched area of the gate 114 with a width labeled $W_{QPC}$ can be seen which forms the quantum point contact device 100. The width of the notched area $W_{QPC}$ can be in a range that can be achieved using current fine lithography techniques that can be between 5 and 20 nanometers. In an example arrangement the width $W_{QPC}$ is less than or equal to about 15 nanometers. The width of the quantum point contact forms a quantum device in a channel region underlying the gate 14. A quantum point contact has a "particle in a box" confinement that occurs in the channel region in the transistor width direction. The quantum point contact sub-bands "turn on" individually, giving rise to quantized jumps in conductivity (from drain to source) $G_{ds}$ with the quantized jumps as a function of the voltage at the gate, $V_{GS}$. For room temperature quantization, the transistor width direction is the same as the length confinement needed for the quantized well behavior described in the U.S. Patent Application Publication No. 2012/00098590, titled "Quantum Electro-Optical Device using CMOS Transistor with Reverse Polarity Drain Implant," referenced above and incorporated herein, e.g. in a range from about 5 to 15 nanometers. The quantum point contact device is not operated as a three-dimensional confinement in a quantization well, instead, it has quantized conductance channels, which is why the quantum point contact device provides a quantum resistance.

The quantum point contact forms a path between doped diffusion source and drain regions that has a conductance that is proportional only to physical constants, as described above. The conductance value can be moderated in quantized or step levels proportional to the potential on the gate conductor. In sharp contrast to the prior known solutions, the conductance for this device is not dependent on either temperature or on process variation factors. Thus an accurate conductance (or inversely, resistance) that is necessarily accurate over temperature and process variations, and which is obtained without the need for complex compensation circuitry, can be attained.

FIG. 2 illustrates a schematic view of an example quantum point contact device 200. The device 200 resembles a MOS transistor and in example arrangements, can be formed in a fabrication process similar to a MOS transistor. Alternatively the device can be formed in a dedicated process for semiconductor fabrication. The device 200 has a source diffused region spaced from a drain diffused region by a constricted channel area underlying a gate as shown in the arrangement of FIG. 1. A quantum point contact is formed in the channel, and as the potential on the gate terminal G varies, the level of the quantized conductance $G_{ds}$ between the drain and source terminals will also vary, but the conductance will vary between quantized levels that are proportional only to the physical constants e and h, as described above.

FIG. 3 illustrates in a top view a gate conductor overlying diffused regions of an arrangement for a quantum point contact device 300 that is similar to the arrangement of FIG. 1. In FIG. 3, an active area 310 includes doped regions forming source and drain areas, lightly doped drain regions 330, and a channel region 340, the channel region including a narrow quantum point contact 311 having a width in the transistor width direction that is again in the range of 5 to 20 nanometers and in an example arrangement can be less than or equal to about 15 nanometers. A gate conductor 320 is shown overlying the channel region and having a narrowed or notched portion of a similar shape as the channel region. The narrowed region forms a quantum device with a constricted path for electrons and holes to travel, forming the quantum point contact device 300. While not visible in FIG. 3, additional implants such as VT adjust implants can be used in the channel region to create a lateral confining potential well.

FIG. 4 depicts the quantized conduction levels in the cross section 4-4' of FIG. 3, illustrating the quantized levels that are experienced by electrons in the constricted area of the quantum point contact arrangement of FIG. 3. The cross section is taken along the transistor width direction of the quantum point device. A conduction path is formed in the narrowed channel region between a drain diffusion and a source diffusion on either side of the channel region. The levels are quantized at levels proportional to the quantity $\frac{1}{13}$ kohms as described above. The conductance levels can be varied in quantized steps using by varying the potential on the gate conductor of the device. In this manner a resistance that has a value independent of temperature and process variation dependencies and proportional to a constant is achieved. By placing a predetermined potential on the gate terminal, the resistance will be a known value independent of temperature and process variations, in sharp contrast to the resistance components of the known prior approaches.

Figure 5:
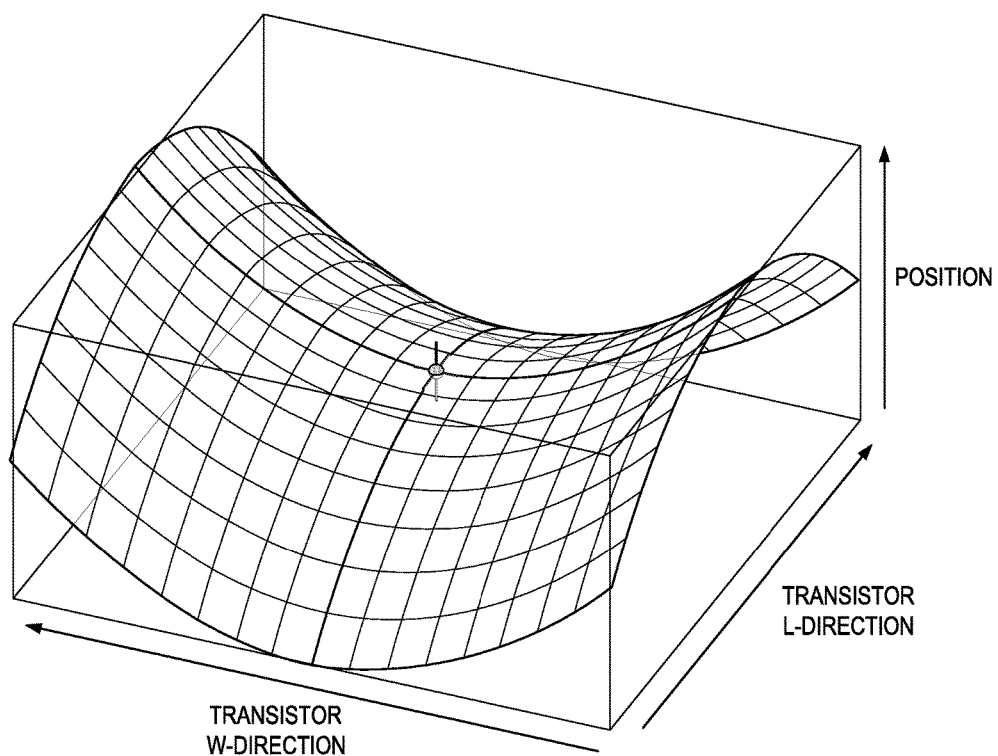
FIG. 5 depicts in a projection the potential diagram for a quantum point contact arrangement such as shown in FIG. 3 in both the width and length directions.

FIG. 5 illustrates a potential diagram showing the saddle shaped conduction potential of the quantum point contact arrangements such as in FIG. 4 in the transistor width or "W" direction of the device and in the transistor length or "L" direction of the device. The quantum point contact device is not a confinement quantum well, but instead, the conduction band is a saddle shaped path with quantized levels, as described above.

Figure 6:
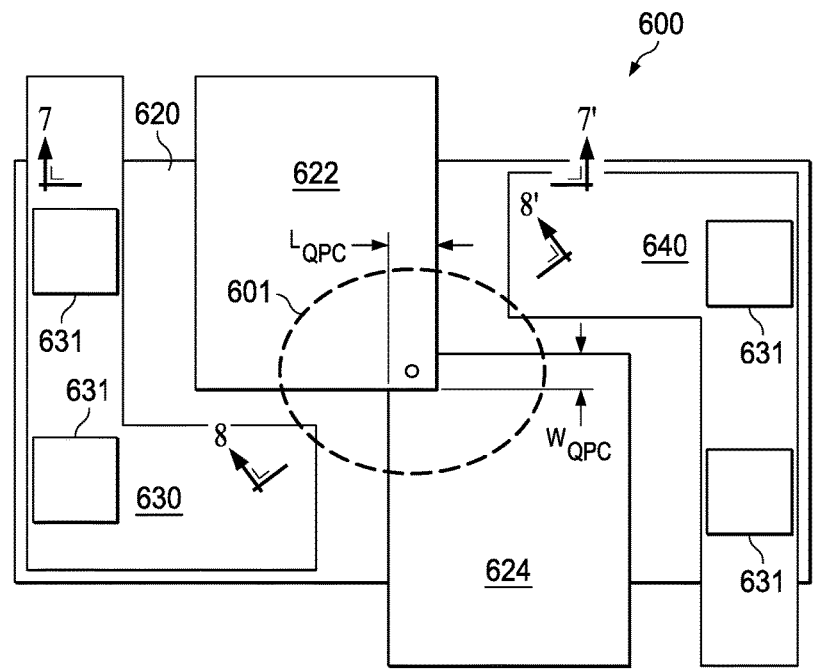
FIG. 6 depicts in a top view diagram an example layout arrangement for forming a quantum point contact device in a semiconductor process compatible with MOS device fabrication.

FIG. 6 depicts in a top view an alternative example arrangement for forming a quantum point contact device 600 having a quantum point contact 601. In FIG. 6 quantum point contact device 600 is formed using an example arrangement that is particularly designed to be highly manufacturable in a MOS process using conventional photolithography. In this arrangement, a constricted channel area for a quantum point contact 601 can be formed which is an overlap between two polygons, so that no extremely narrow polysilicon areas need to be formed. Using photolithography, patterning and etch to form very small dimension geometries in a semiconductor process can result in lower yields if the process varies, which can cause an open to form, or that can result in an unwanted thinning of the small features. Alignment variations can also cause an error in the formation of the small dimension geometries that could expand the dimension and thus, cause the dimension to be too large for the confinement needed for the quantum device. To increase the manufacturability of the regions needed to form the quantum device 600, an arrangement formed using overlapping rectangles or squares is shown in FIG. 6.

In FIG. 6, an active area 620 formed in a semiconductor substrate is shown. Source and drain contact areas 631 are formed to form the terminals of the quantum point contact device. Source region 630 and drain region 640 are doped diffusion areas. A gate structure formed of doped or undoped polysilicon regions 622, 624 is formed over a gate dielectric (not visible in this top view) lying over a channel region between doped drain and source diffusion regions. The gate structure includes two polygon shapes 622, 624 which can be squares, or rectangles, with an overlap in a corner portion of each of the two polygon shapes, the constricted part of the quantum point contact device 600 is formed in this overlapping region 601. The arrangement of FIG. 6 provides a quantum point contact device 600 that is arranged to avoid known issues with photolithographic processes, the constricted quantum point contact 601 of the gate is provided without notches, chamfers or steps that could close or form opens due to the extremely small dimensions needed. In FIG. 6, the length of the area 601 where the quantum point contact is formed, labeled $L_{QPC}$, and the width where the quantum point contact is formed, labeled $W_{QPC}$, are arranged to meet the criteria shown in Equation 1:

$$\text{MAX}[L_{QPC}, W_{QPC}] < 35 \text{ nanometers; both } L_{QPC}, W_{QPC} > 0.\qquad \text{Equation 1}$$

Additional criteria are:

No polysilicon geometry with dimension less than a minimum, for example, 35 nanometers No polysilicon notches No polysilicon stepping or chamfers By forming the quantum point contact device 600 using a layout arrangement in a manner that satisfies the criteria of Equation 1, the quantum point contact device 600 has increased manufacturability in a conventional MOS semiconductor process using existing photolithography, pattern and etch processes and tools. By forming the device 600 while avoiding the need for geometries and shapes that tend to increase yield problems when using conventional photolithographic tools and process steps in a semiconductor process, the example arrangement of FIG. 6 provides a quantum point contact device that can be manufactured at relatively low costs.

Figure 7:
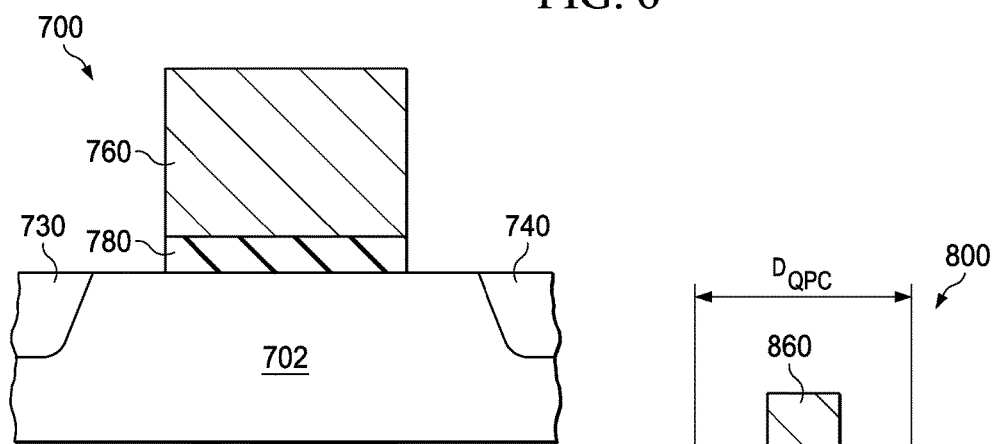
FIG. 7 illustrates in a cross sectional view a portion of a quantum point contact arrangement such as the quantum point contact depicted in FIG. 6.
Figure 8:
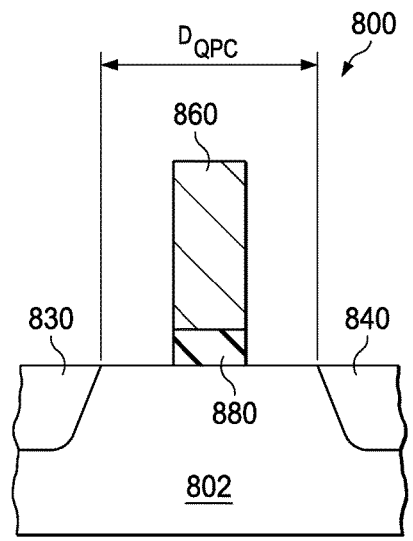
FIG. 8 illustrates in a further cross sectional view another portion of a quantum point contact arrangement such as the quantum point contact depicted in FIG. 6.

In order to further illustrate the features of the quantum point contact device 600 presented in FIG. 6, two different cross sections are depicted in FIGS. 7 and 8. In FIG. 7 a simplified cross section of the section of the quantum point contact device 600 labeled 7-7' in FIG. 6 is shown. The cross section 700 depicts a portion of the semiconductor substrate 702, a drain/source region 730, a source/drain region 740, a gate dielectric layer 780, and a gate conductor 760. The drain/source region 730 and the source/drain region 740 can each be formed of a doped diffusion region such as a lightly doped drain (LDD) region that is a first conductivity type. For example the drain/source region 730 and the source/drain region 740 can be N type regions to form an "NMOS" type device that has doped diffused portions similar to those for an NMOS transistor. In this case, the substrate portion 702, which can be an ion implanted well region in a substrate or in an alternative arrangement, which can be an epitaxial layer, can be doped to a second conductivity type such as a P-type well. In a semiconductor substrate multiple well areas can be formed of both P and N types, using implanted impurities to dope the substrate, the wells can be electrically isolated using shallow trench isolation (STI), or using LOCOS isolation for example. The gate dielectric 780 can be formed of any of a plurality of gate dielectric materials, such as silicon dioxide, hafnium oxide or other insulating materials and having a thickness between about 1 nm and about 30 nm is formed on the top of the semiconductor portion 702 by known methods. A gate conductor 760 is formed over the gate dielectric layer and can be formed of polysilicon, doped polysilicon and in other arrangements, can be replaced with a metal gate material.

The cross section of the quantum point contact 700 illustrates the similarity of portions of the quantum point contact device to a conventional MOS transistor. The structure of the quantum point contact device 600 in FIG. 6 can be produced in a conventional MOS transistor fabrication process. In another arrangement, the quantum point contact device (or a plurality of quantum point contact devices) can be formed simultaneously with the formation of MOS transistors in the same integrated circuit. If the process includes both NMOS and PMOS transistors, the semiconductor process is said to be a CMOS process. In this manner, an arrangement including the quantum point contact device on an integrated circuit can be formed with accompanying transistors and circuits, to form an integrated circuit having accurate resistors and transistors in the same circuitry.

FIG. 8 depicts in another cross sectional view the portion of the arrangement quantum point device 600 of FIG. 6 taken along section 8-8' in FIG. 6. In FIG. 8, cross section 800 includes a substrate 802, a source/drain region 830, a drain/source region 840, a gate conductor 860 and a gate dielectric 880. The cross section of FIG. 8 illustrates the portion of the quantum point contact device that is in the conduction path, e.g., the diagonal path $D_{QPC}$ taken at the narrow constriction of the quantum device between the source and drain regions. In an arrangement the distance $D_{QPC}$ in FIG. 8, the width of the constriction of the quantum point contact is less than about 20 nanometers, and in an illustrative example arrangement, is between 5-15 nanometers. In another example the distance $D_{QPC}$ is approximately equal to 15 nanometers.

Figure 9:
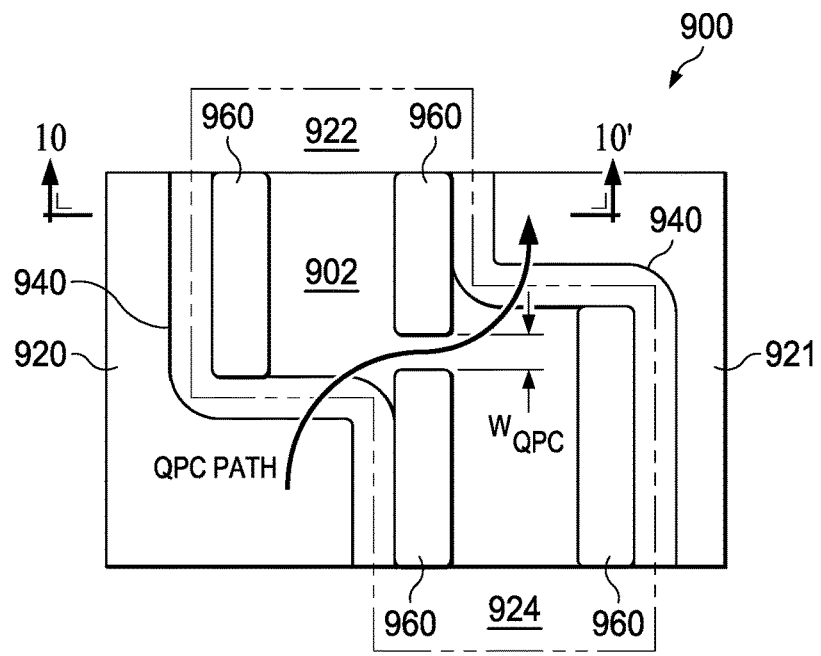
FIG. 9 depicts in a plan view an example arrangement for forming a quantum point contact depicting diffusion regions in a semiconductor substrate.

FIG. 9 illustrates in a top view 900 an additional alternative arrangement. In FIG. 9, a drain/source region 920 is formed by implanting impurities in a substrate 902. A source/drain region 921 is likewise formed by implanting impurities in substrate 902. In an example illustrative arrangement, the drain/source region and the source/drain region can be doped to a first conductivity type, such as an N-type, while the substrate 902 is doped to a second conductivity type, such as P-type, to form for example a P-well. A lightly doped drain region 940 is formed. As in forming MOS transistors, the lightly doped drain region is also formed by implanting impurities. To form LDD region 940 adjacent the drain/source region 920 and the source/drain region 921, a diffusion process is used to extend the LDD region beneath a portion of the gate structure formed by the two gate portions 922, and 924. As described above the gate regions intersect at a corner portion of the two polygons that form the gate portions 922, 924, and the intersection meets the criteria of Equation 1 to form the quantum point contact device. In FIG. 9, pocket implants 960 are shown. These pocket implants (sometimes referred to as "halo" implants) are formed using a 2-rotation tilt or angled implant approach. U.S. Pat. No. 7,994,009, titled "Low Cost Transistors using Gate Orientation and Optimized Implants", listing inventors Benaissa et al., which is co-owned with the present application and which is hereby incorporated herein by reference in its entirety, describes appropriate example ion implantation steps. In this approach, the pocket implants are only made in the vertical direction in FIG. 9, and not in the horizontal direction, because the tilt or angled pocket implants are not made in all 4 possible rotation directions, but are only made in 2 rotation directions. The pocket implants form the constricted area in FIG. 9 labeled width $W_{QPC}$ and an opening in the pocket implants is controlling the width. The pocket implants can be formed using tilt or angled implants of a second conductivity type, for example, of P-type dopants, to further control the channel portion. In addition, substrate 902 can also have threshold voltage or Vt adjust implants performed in the channel region beneath the gate structure. These pocket implants can also be performed in conjunction with or contemporaneously with pocket implants used to form NMOS or PMOS transistors elsewhere on the substrate.

The arrangement of FIG. 9 forms an "enhancement mode" device. In this arrangement, as the potential on the gate conductor 922 increases, the conductance will vary and will vary in quantized levels proportional to the physical quantity ratio $2e^2/h$, where e is the electron charge, and h is Planck's constant, inversely this forms a resistance proportional to approximately $1/13$ kohms that depends only on physical constants, as is described above. The width $W_{QPC}$ provides the confinement for the quantum effect and is between 5-20 nanometers in an example arrangement, and in another particular example, is 15 nanometers. The threshold voltage needed for conduction will be similar to the threshold for a "natural NMOS" device, a low Vt device, and will be between 0.2-0.4 Volts for typical CMOS processes. This threshold voltage is process dependent; however the conductance will vary in quantized levels as a function of the threshold voltage, so that a known conductance proportional only to physical constants can be accurately obtained for the device.

Figure 10:
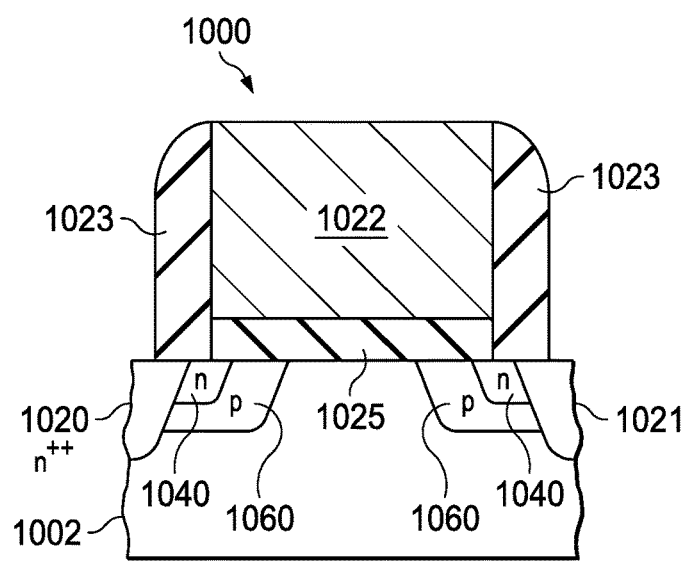
FIG. 10 depicts in a cross sectional view a first portion of an arrangement such as the one illustrated in FIG. 9 for forming a quantum point contact of the present application.

FIG. 10 depicts in a cross sectional view 1000 a portion of the arrangement of FIG. 9 taken along the section labeled 10-10'. In FIG. 10, a portion of a semiconductor substrate 1002 is shown. The portion of the substrate 1002 can be, for example, a doped region to form a P-well or in an alternative arrangement region 1002 can be doped to form an N-well. An epitaxial layer can also be used. In FIG. 10, regions 1020 and 1021 are doped diffusion regions that form a drain/source and a source/drain for the device 1000. Lightly doped drain (LDD) regions such as 1040 can be formed to extend the doped regions beneath the outer portions of the gate 1022. Pocket implants can be performed using, for example, tilted or angled ion implantation and form pocket regions 1060.

In the example arrangement of FIG. 10, the quantum point contact device shown in the cross section 1000 is formed in a manner similar to an NMOS transistor, so that the drain/source and source/drain regions are doped to an N-type conductivity, the LDD regions 1040 are also doped to an N-type conductivity, and the substrate 1002, and the pocket implant regions 1060, are each doped to a P-type conductivity. In this manner the device has doped regions that correspond to the doped regions used to form an NMOS transistor. In an alternative arrangement that will be clear to the reader of skill in the relevant art, a quantum point contact device can be formed that uses doped diffusion regions that correspond to a PMOS transistor, with P-type drain/source and source/drain regions in an N-type substrate or N-type well.

In FIG. 10, a gate structure 1022 overlies the substrate 1002 and forms a channel portion between the drain/source region 1020 and the source/drain region 1021. The gate dielectric layer 1025 lies beneath the gate structure 1022, and the gate also has insulating sidewall portions 1023 formed of an oxide or oxynitride. In operation the arrangement of FIGS. 9 and 10 is similar to an "enhancement mode" NMOS device. As the potential on the gate is increased, the conductance $G_{DS}$ will vary in a stepwise manner corresponding to the quantized conductance levels.

Figure 11:
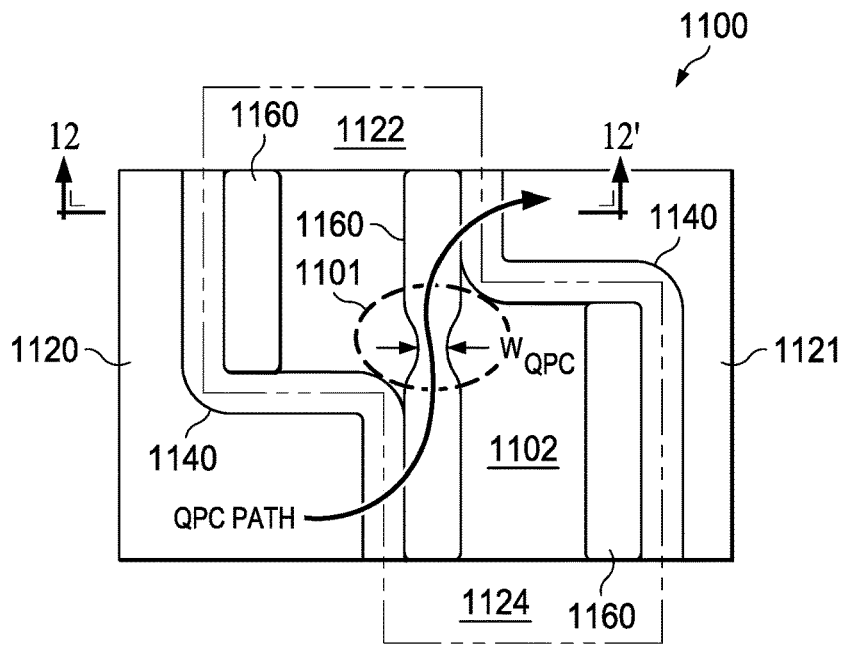
FIG. 11 depicts in a top view an alternative arrangement for a quantum point contact illustrating doped diffused regions.

FIG. 11 illustrates a top view of doped diffusion regions for an alternative arrangement of a quantum point contact device 1100. In FIG. 11, doped diffusion regions 1120 and 1121 form a drain/source and source/drain diffusion region respectively. LDD regions 1140 are formed extending the drain/source and source/drain regions beneath the outer edges of the gate structure which is formed from two gate portions 1122 and 1124. As described above, the two gate portions overlap in a corner region forming a constricted area for the quantum device. In the arrangement of FIG. 11, pocket implants such as 1160 are formed beneath the LDD diffused regions by a tilted or angled ion implant. As described above, the pocket implants of the arrangements are formed using only 2 rotation implants, so that no pocket implant is formed in the horizontal direction, instead the pocket implants are formed only in the vertical direction. The polysilicon is also oriented in the vertical direction and is not oriented in the horizontal direction. In addition the channel can receive VT adjust doping implantation to further tailor the lateral confinement well.

In the arrangement of FIG. 11, the diffused regions and the pocket implants are altered using implant dopants to form a device the resembles a "depletion mode" device. The current path labeled "QPC Path" flows through the constricted area to provide the quantum point contact 1101. The width $W_{QPC}$ in FIG. 11 is a small distance that is less than about 20 nanometers. In one example arrangement the width $W_{QPC}$ in FIG. 11 is less than or equal to about 15 nanometers. In another non-limiting example arrangement, the $W_{QPC}$ in FIG. 11 is between 5 and 20 nanometers.

Figure 12:
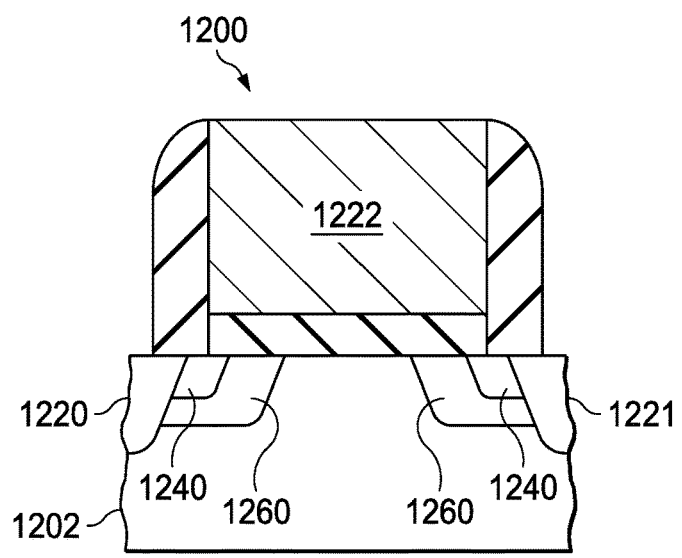
FIG. 12 depicts in a cross sectional view a portion of the arrangement of FIG. 11.

FIG. 12 depicts in a cross sectional view 1200 the section portion of the quantum point contact device 1100 of FIG. 11 labeled 12-12'. In FIG. 12, the cross sectional view depicts the substrate 1202, which can be a P-type substrate or can be doped to form a P-well for example by using P-type dopants, a drain/source region 1220, a source/drain region 1221, pocket implants 1260 and the LDD regions 1240. The gate structure 1222 corresponds to the gate structure 1122 in FIG. 11. In the arrangement depicted in FIG. 12, the LDD diffusions and the pocket implants are "reversed" from the arrangements of FIGS. 9 and 10. In FIG. 12, the drain/source and source/drain regions can be doped to an N-type conductivity, for example. The LDD regions 1240 in this example arrangement are doped to a P-type conductivity. The pocket implants 1260 are doped to N-type conductivity. The resulting quantum point contact device operates in a mode similar to a "depletion" mode NMOS device, in that as the voltage on the gate 1222 is reduced farther below a threshold, the device conducts and the conductance is again quantized, that is, the conductance will transition through a series of quantized steps, varying with the now negative potential on the gate 1222.

FIGS. 13-20 depict cross sectional views in a series of steps an example method for fabricating the quantum point contact devices described above in a CMOS semiconductor process. While FIGS. 13-20 illustrate an example series of steps for forming the quantum point contact devices, one skilled in the art will recognize that in some cases, the order of steps can be changed, and known alternative steps can be used, to form additional arrangements that form additional aspects of the present application. For example, the pocket implants described above can be omitted in some arrangements to form additional alternative arrangements. Additional VT adjust and channel implants can be used to further tailor the constriction area in the channel and these alternatives form further arrangements and aspects of the present application.

Figure 13:
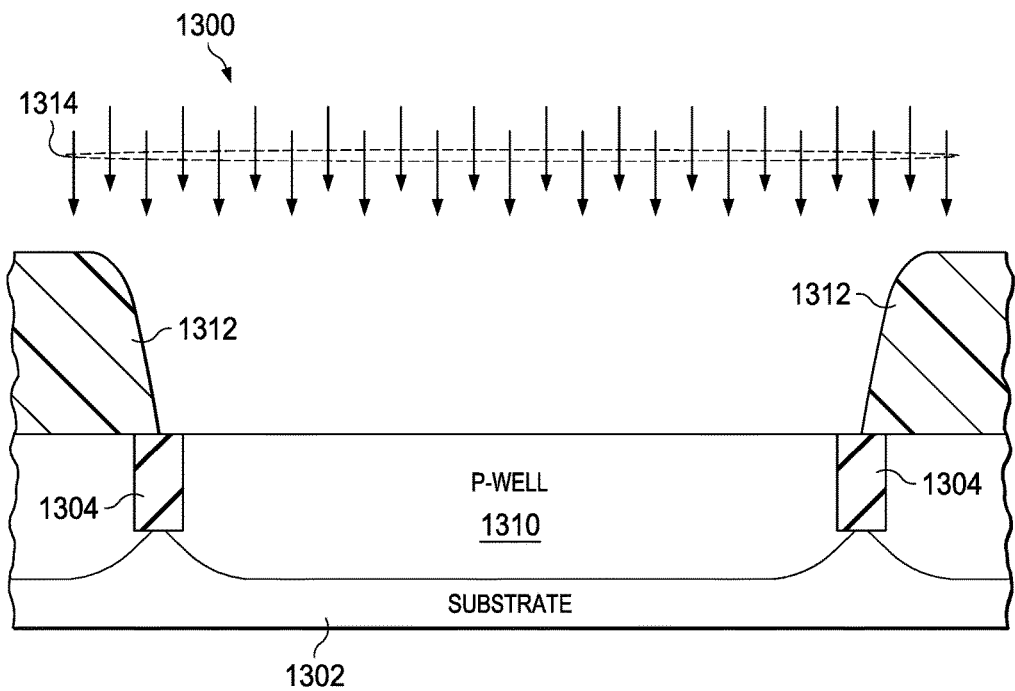
FIG. 13 is the first in a series of cross-sectional views depicting the successive processing steps used to manufacture a quantum point contact device using a CMOS semiconductor process.

FIG. 13 depicts in a first cross sectional view 1300 the step of forming a well region by ion implantation and the well electrically isolated from additional well regions in a substrate 1302. The semiconductor substrate 1302 that will include the quantum point contact device (and, in some arrangements that form aspects of the present application, which can also host other MOS transistor devices) can typically be a P-type single crystal silicon substrate. It is also within the scope of the present application to use any substrate that supports fabrication of an integrated circuit in a CMOS process including, but not limited to silicon-on-insulator (SOI) or a hybrid orientation technology (HOT) substrate, or on any epitaxial layer compatible with CMOS semiconductor fabrication. Furthermore, it is contemplated that the same quantum point contact structures can be formed in III-V semiconductor compounds such as, but not limited to, gallium nitride (GaN), indium phosphide (InP) and indium arsenide (InAs). These semiconductor compounds can be full substrates or can simply be epitaxial layers on other host substrates.

In FIG. 13, electrically isolated regions or wells in a semiconductor substrate 1302 are created using, in one example arrangement, a shallow trench isolation (STI) process in which trenches or moats 1304, commonly 200 to 500 nanometers (nm) deep that are etched into the substrate 1302. The trenches 1304 can be filled with a dielectric material using thermal oxidation and HDP, PECVD or other dielectric deposition methods. Alternative isolation approaches between the wells include forming LOCOS (localized oxidation of silicon) regions. Subsequently, a photoresist for patterning, in this particular non-limiting example, P-wells, is selectively applied on the wafer surface leaving exposed regions to be implanted with P-type impurities 1314 such as, for a non-limiting example, boron atoms in concentrations from $1$-$10^{11}$ to $1$-$10^{14}$ atoms/cm$^2$. The ion implant forms P-wells 1310 which extend from a top surface of the substrate 1302 to a depth typically 50 to 500 nm below the bottom of the STI regions 1314. The adjoining wells (partially visible in FIG. 13 on either side of P-well 1310) can be doped to P-type or N-type conductivity, depending on the dopant applied for the desired transistor type. Once the ion implantation forming P-wells 1310 is completed, the photoresist 1312 can be removed using known photoresist strip and clean processes leaving the P-well 1310 electrically isolated by the STI regions 1304.

Figure 14:
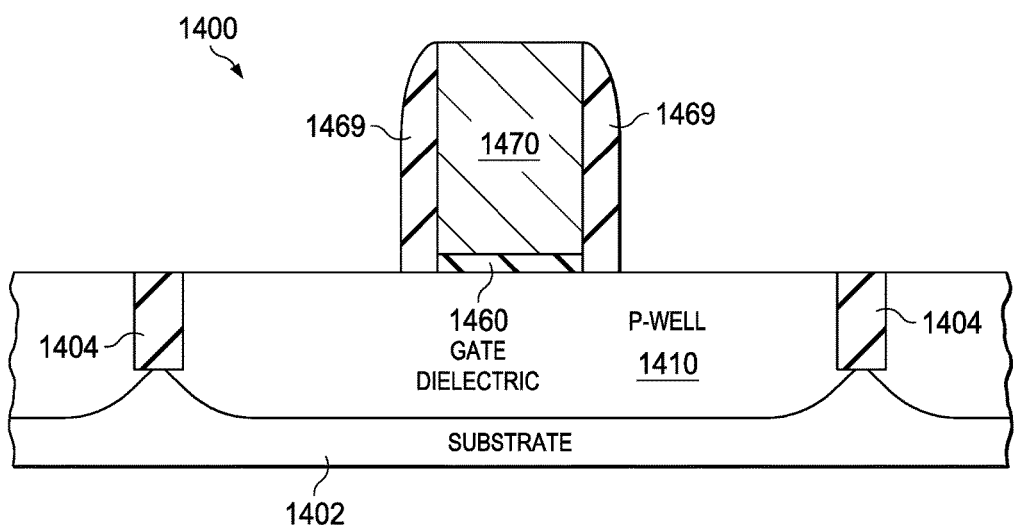
FIG. 14 is a next step in the series depicting a cross-sectional view of the construction of a quantum point contact device such as the one illustrated in FIG. 13 and forming a gate structure.

FIG. 14 depicts, in another cross sectional view, a device 1400 which corresponds to the device 1300 in FIG. 13 following additional steps. In FIG. 14, device 1400 includes a gate dielectric layer 1460, typically of silicon dioxide, hafnium oxide or other insulating materials and having a thickness between about 1 nm and about 30 nm is formed on the top of the substrate 1402 by known methods in a central portion of the well region 1410. In one arrangement that forms an aspect of the present application, NMOS gate and PMOS gate dielectric layers or gate insulators (not shown in FIG. 14) in other portions of the substrate 02 can be fabricated with similar materials and similar thicknesses, and can be formed concurrently in time with the gate dielectric 1460. Alternatively the PMOS and NMOS gate dielectrics can be formed independently of the gate dielectric 1460 and of different materials and/or thicknesses.

Still referring to FIG. 14, a gate 1470 is formed on top of the gate dielectric 1460. The gate 1470 is typically formed from polycrystalline silicon, referred to as polysilicon. The polysilicon is deposited over the gate dielectric layer 1460 and can also be deposited over NMOS and PMOS gate dielectric layers (not shown) to form NMOS and PMOS gate structures elsewhere on the substrate 1402. A gate photoresist pattern, not illustrated here for simplicity, is then applied over the gate material and patterned for an etch process. Any unwanted gate polysilicon and the unwanted portions of the underlying gate dielectric 1460 are removed by known etching methods. The gate photoresist is then also removed. The gate structures for any NMOS and/or PMOS transistors that are disposed in wells other than wells 1410 can be simultaneously patterned while the gate polysilicon 1470 is formed. In some arrangements that form additional aspects of the present application, a replacement gate such as a metal gate can be used to replace the polysilicon gate 1470 at a later processing step. As shown in FIG. 14, gate spacers 1469 are then formed of an insulator such as an oxide, oxynitride, or nitride layer. The gate spacers 1469 can be formed by oxide growth on the polysilicon 1470 or by other known means. The gate spacers can be patterned by an anisotropic etch step. As for other steps described herein, gate structures for NMOS and/or PMOS devices being contemporaneously fabricated on substrate 1402, not visible in FIG. 14, can be formed simultaneously.

Figure 15:
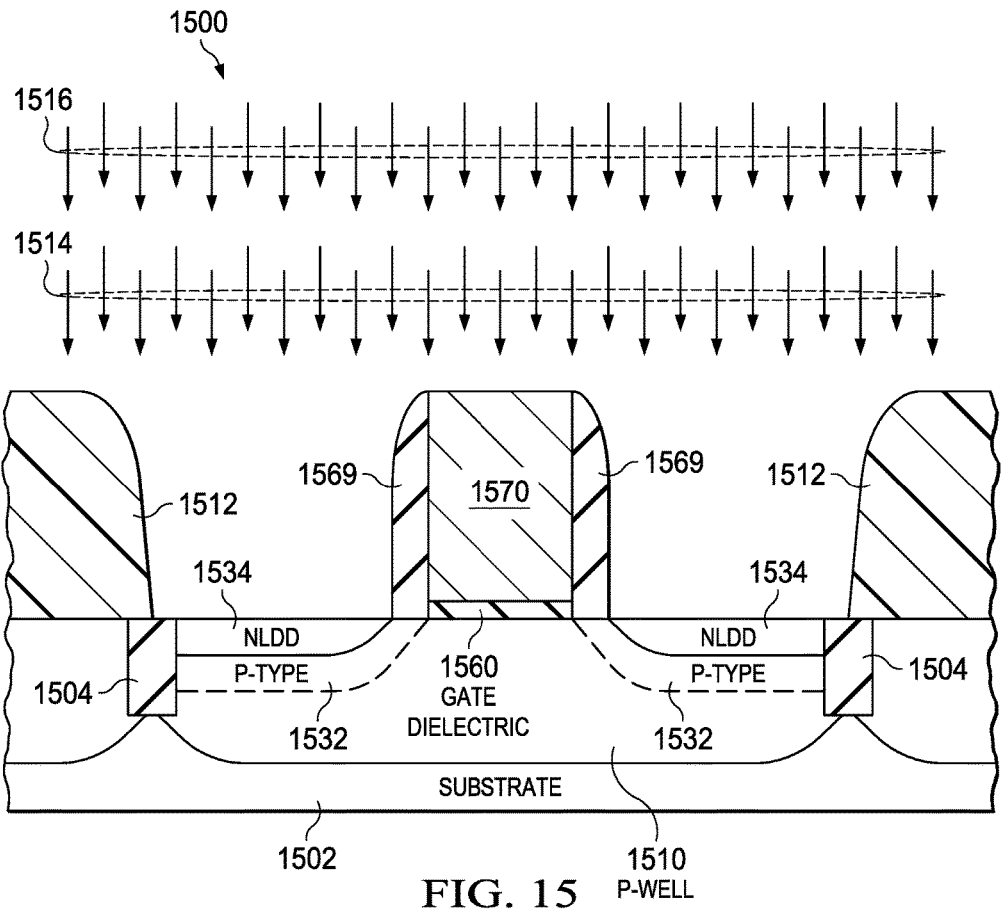
FIG. 15 is a next step in the series depicting a cross-sectional view of the construction of a quantum point contact device such as the one illustrated in FIG. 14, illustrating a photoresist and ion implantation.

FIG. 15 depicts a next step in a cross-sectional view of the construction of a quantum point contact device 1500 illustrating another photoresist 1512 and a series of ion implantation steps. In FIG. 15 photoresist 1512 is applied to the surface of the substrate 1502 and patterned leaving openings for implanting P-type impurities 1514 to form optional pocket regions 1532, and then using the same photoresist 1512, implanting N-type impurities 1516 to form N-type lightly doped drain (NLDD) regions 1534. The gate spacer 1569 is used to space the ion implant dopants from the channel region under the gate 1570. Note that while the implants shown for the device 1500 are being performed, additional implants of P-type pocket implants, and other N-type LDD regions, can be formed simultaneously in other NMOS and PMOS transistor regions (not visible in FIG. 15). P-type dopants 1514 are first implanted, in one arrangement, to form P-type pocket regions 1532. The impurities 1514 in the P-type implant can be boron, gallium or indium, for example, in concentration ranges from about $1\times10^{11}$ to about $1\times10^{14}$ atoms/cm$^2$. The implant of the dopants 1514 can be performed at an angle or tilt to reach the substrate beneath the gate spacers 1569 as shown. As described above, the pocket implants are formed using a 2 rotation tilt implant approach, and so the pocket material only forms in the vertical direction in FIGS. 9 and 11, for example. The N-type implantation 1516 then is performed to form the lightly doped drain region 1534 (labeled NLDD). The impurities used in the N-type implant 1516 can be phosphorus and arsenic in concentration ranges from about $1\times10^{13}$ to about $5\times10^{14}$ atoms/cm$^2$, for example. After the implanting step, the photoresist 1512 can be removed with known processes.

Figure 16:
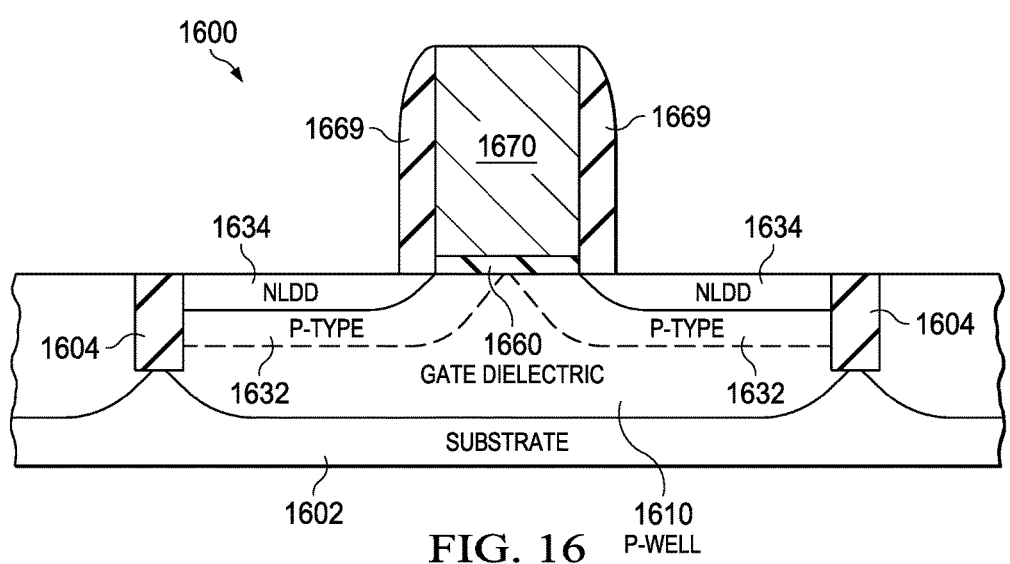
FIG. 16 is a next step in the series depicting a cross-sectional view of the construction of a quantum point contact device such as the one illustrated in FIG. 15.

FIG. 16 illustrates in another cross-sectional view 1600 depicting doped regions of the quantum point contact device after an anneal step to complete the doped regions. The doped regions are the P-well 1610, the optional P-type pocket regions 1632, and the NLDD region 1634. In the arrangement of FIG. 11, the pocket regions 1632 are optional and in another alternative process that is contemplated as forming an additional arrangement of the present application, they can be excluded. In the arrangement of FIG. 9, however, the pocket implants are needed. At this stage in the processing of the device 1600, portions of the implanted doped regions 1632, 1634 and 1610 can be activated by performing a thermal anneal. Anneals can be performed using known methods such as rapid thermal processing (RTP) or laser annealing or by use of an oven. In an alternative approach, thermal processing can be performed between some of the steps described above.

Figure 17:
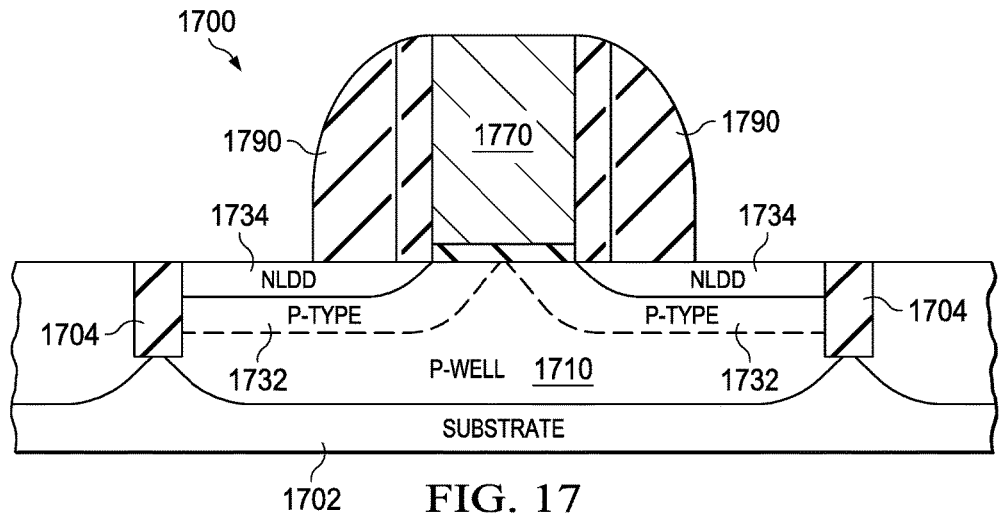
FIG. 17 is a next step in the series depicting a cross-sectional view of the construction of a quantum point contact device such as the one illustrated in FIG. 16, illustrating gate sidewall formation.

FIG. 17 depicts a next step in the process in a cross-sectional view of the construction of a quantum point contact 1700 illustrating creation of gate spacers. The gate spacers 1790 are formed on the lateral surfaces of the gate 1770 and over the sidewall spacers. The gate spacers 1790 are typically formed from a layer of silicon dioxide between 1 and 10 nm thick. Other dielectric materials can also be used. The gate spacers 1790 can commonly be formed by oxidation of the polysilicon of the gate 1770 or by conformal deposits silicon dioxide and/or silicon nitride. The gate spacers 1790 can have a different thickness than NMOS or PMOS gate spacers also formed on the substrate 1702, or can be the same thickness. After formation the gate spacers 1790 are patterned and/or etched to remove any unwanted deposited material.

Figure 18:
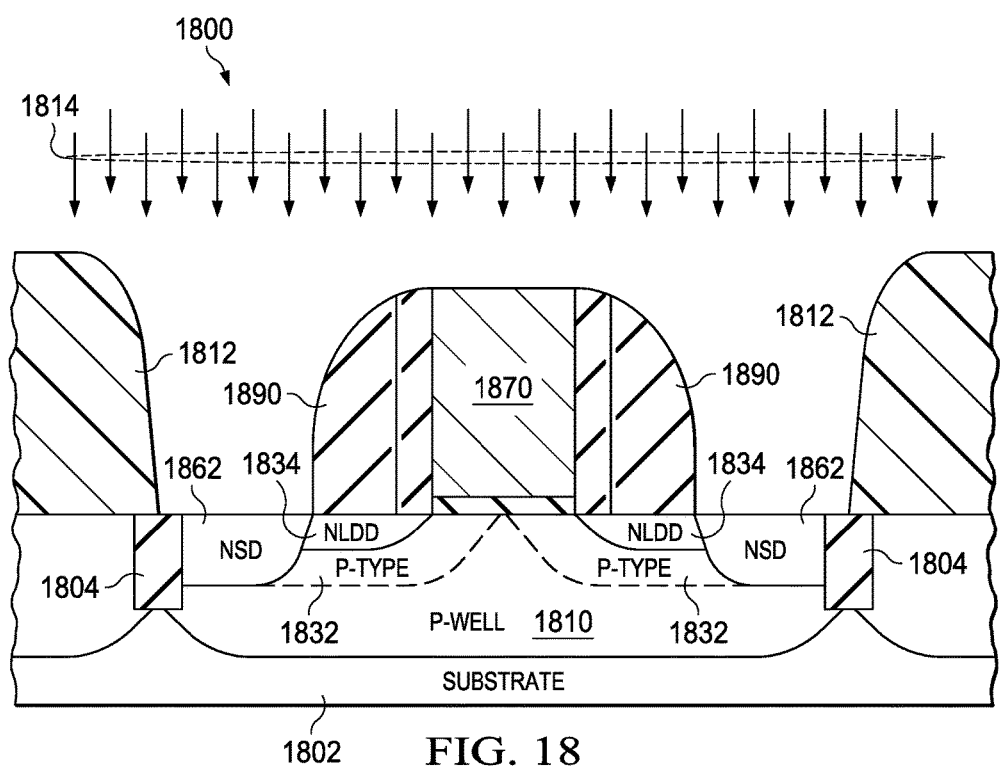
FIG. 18 is a next step in the series depicting a cross-sectional view of the construction of a quantum point contact device such as the one illustrated in FIG. 17, illustrating forming doped drain/source regions and source/drain regions in the active silicon region.

FIG. 18 depicts in another cross-sectional view a next step of the construction of a quantum point contact 1800 illustrating an N-type source-drain implant in drain/source and source/drain regions 1862. In FIG. 18 a photoresist 1812 is applied to the surface of the substrate 1802 and patterned leaving openings for implanting ions into to form regions 1862 for the quantum point contact. The impurities in N-type implant 1814 can be phosphorus and arsenic, for example, in concentration ranges from about $1\times10^{14}$ to about $5\times10^{16}$ atoms/cm$^2$. After the ion implantation, the photoresist 1812 is removed with known processes. Note that the ion implantation 1814 can be used to form N-type source drain regions elsewhere on the substrate, for NMOS transistors, for example for devices that are not visible in FIG. 18.

Figure 19:
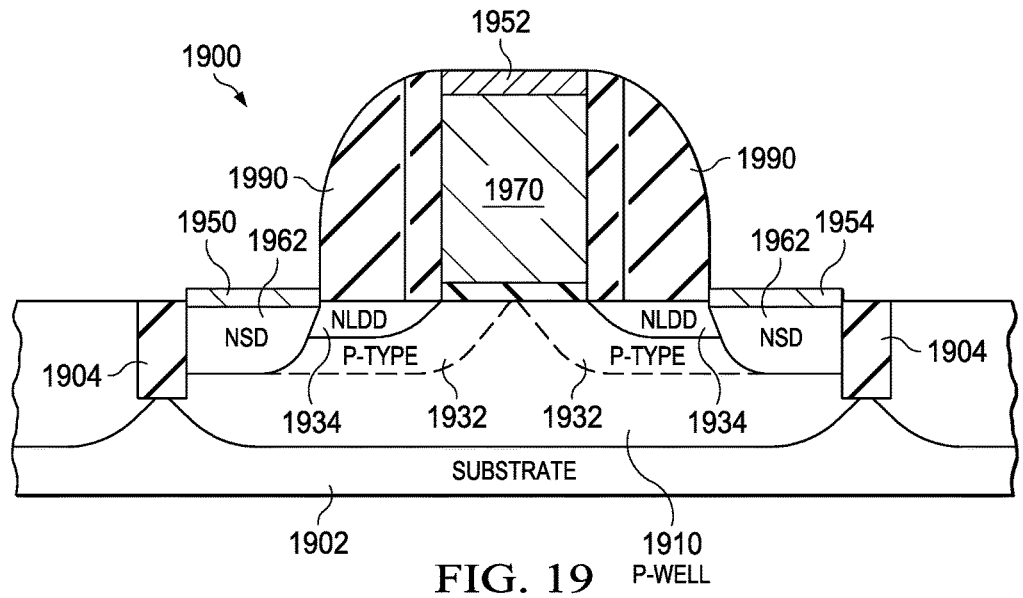
FIG. 19 is a next step in the series depicting a cross-sectional view of the construction of a quantum point contact device such as the one illustrated in FIG. 18, illustrating metal silicide depositions.

FIG. 19 depicts a next step in a cross-sectional view of the construction of a quantum point contact device 1900 illustrating a metal contact deposition. In one arrangement, the polysilicon in the gate 1970, and the two NSD doped regions 1962 are partially replaced by metal or metal silicide by known processes. For one non-limiting example, nickel may be deposited on the top surfaces of the gate 1970, NSD regions 1962 followed by heating of the substrate 1902 to react the nickel with the underlying polysilicon to form metal silicide. A wet etch, or other known process, can be employed to selectively remove the unreacted nickel leaving the metal silicide layer forming a drain silicide 1950, the gate contact 1952 and on the source silicide 1954. Other metals can be used. Silicide contacts can simultaneously be performed in other portions of the substrate 1902 and form silicide contacts for NMOS or PMOS transistors elsewhere in the substrate. The gate spacers 1990, the lightly doped drain regions 1934, the pocket regions 1932, and the P-well 1910 are arranged as described above.

Figure 20:
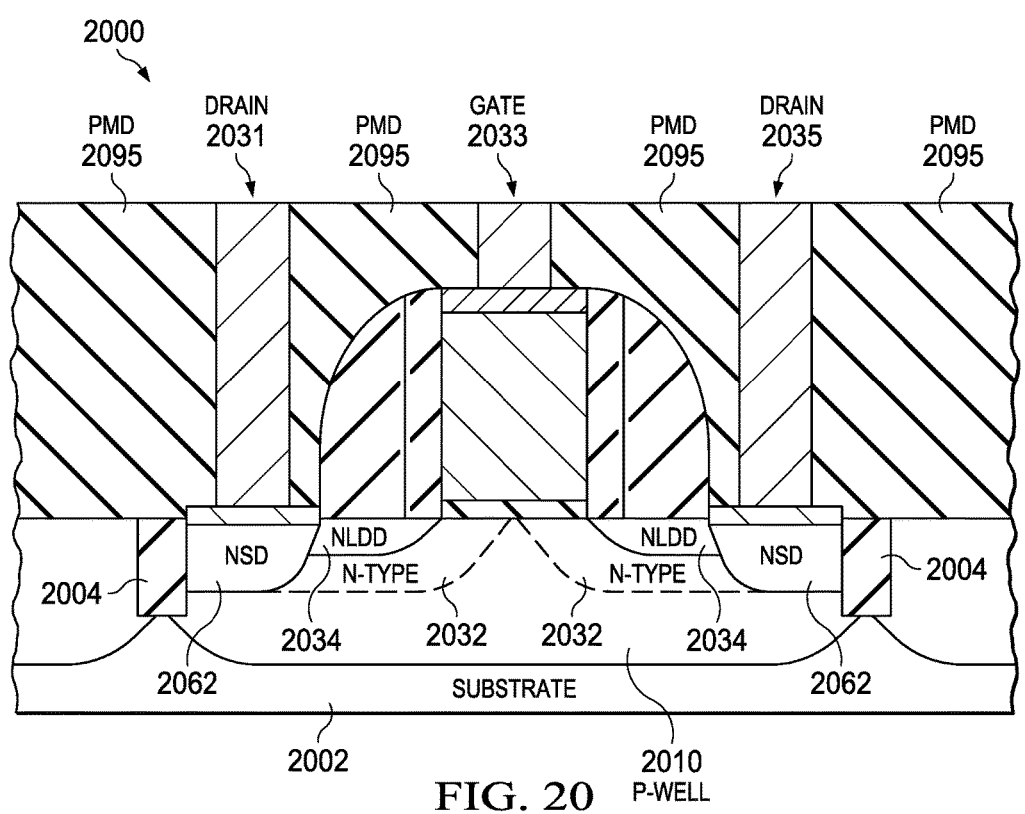
FIG. 20 is a next step in the series depicting a cross-sectional view of the construction of a the quantum point contact device such as the one illustrated in FIG. 10, illustrating pre-metal dielectric and contact tungsten formation.

FIG. 20 depicts in another cross-sectional view 2000 the construction of a quantum point contact illustrating forming pre-metal dielectric (PMD) 2095 and tungsten conductors. Referring to FIG. 20, a PMD layer 2095, typically consisting of thin layer of silicon nitride or silicon dioxide, deposited 10 to 100 nanometers thick, is followed by formation of a 100 to 1000 nanometer layer of silicon dioxide or phosphorsilicate glass (PSG). In one example process, the PMD layers can be deposited using PECVD and then can be planarized by a chemical-mechanical polish (CMP) process. An optional PMD top layer, commonly 10 to 100 nanometers thick of a hard material such as silicon nitride or silicon carbide can be formed on the top surface of the substrate 2002. Alternative known processes for forming PMD layers can be performed. Drain contact 2031, gate contact 2033 and source contact 2035 which make physical and electrical contact with the metal silicide contacts below them are formed in the PMD layer 2095 by known methods, including using a photoresist pattern on the top layer of the PMD to expose the contact area, etching contact holes thru the PMD down to the metal silicide on the substrate 2002 and filling the contact holes with a contact liner and subsequently forming contact fill metal, typically tungsten. The processes described here are non-limiting examples and other alternative processes for forming the contacts can be performed and these alternatives form additional arrangements of the present application.

At the stage shown in the cross-sectional view 2000 of FIG. 20 the quantum point contact device is complete. The arrangement described in FIGS. 13-20 corresponds to the "enhancement" device illustrated in FIGS. 9 and 10. The ion implant steps can also be modified to form the "depletion" mode device illustrated in FIGS. 11 and 12 by modifying the ion implant atoms to change the conductivity types. One skilled in the art will realize that by implanting P-type LDD regions, and N-type pocket regions, instead of the N-type LDD and P-type pocket regions shown in the series of steps illustrated in FIGS. 13-20 above, the alternative arrangement quantum point contact device can be formed.

Figure 21:
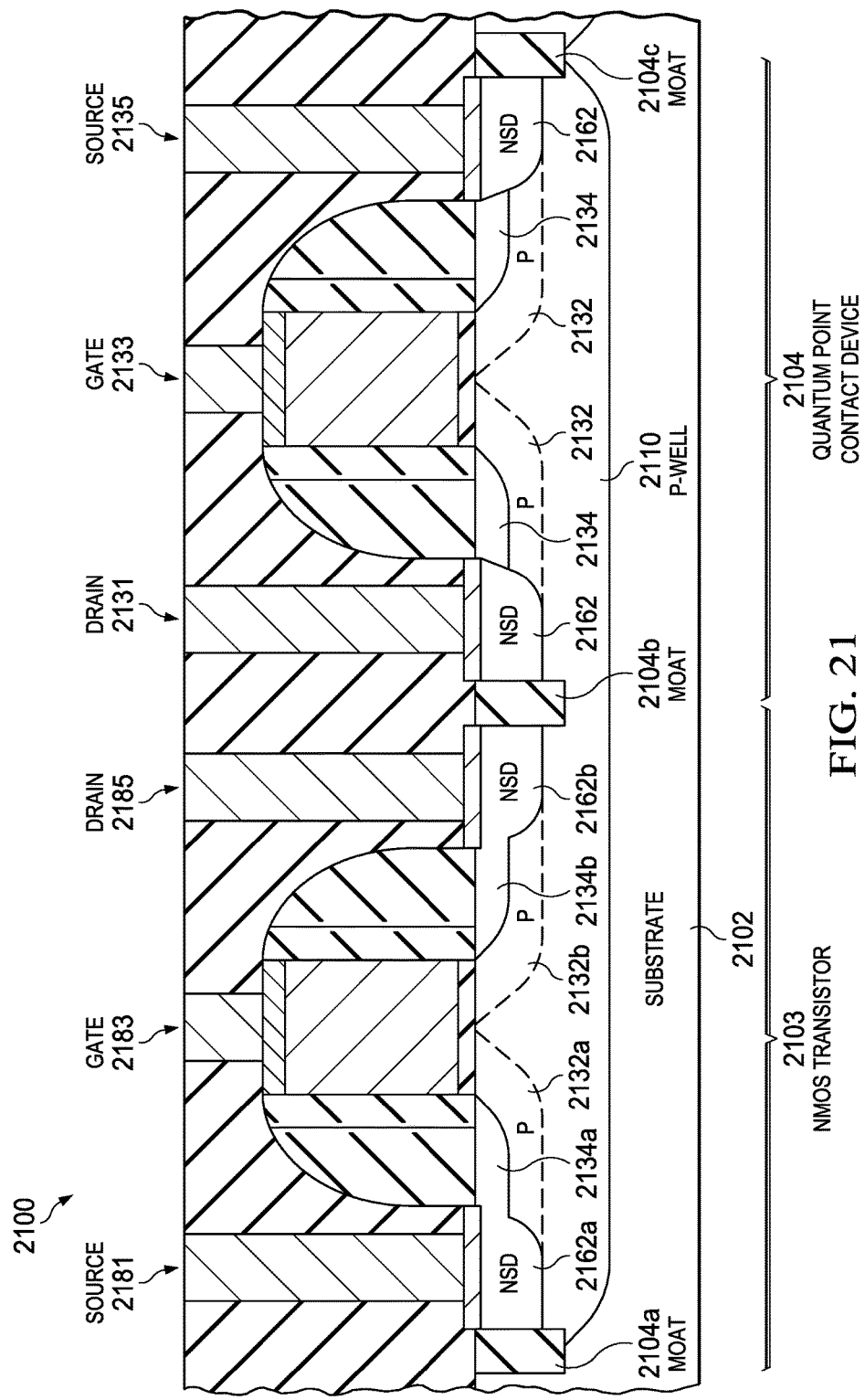
FIG. 21 depict in a cross-sectional view a quantum point contact device and a MOS transistor fabricated together on a single integrated circuit.

FIG. 21 illustrates in a cross-sectional view an arrangement 2100 including an NMOS transistor 2103 and a quantum point contact device 2104 constructed adjacent to each other in a well region 2110 over substrate 2102. The devices in FIG. 21 can be built concurrently within the same MOS fabrication process. The substrate 2102 contains a P-well region 2110 which spans a pair of regions electrically isolated by STI 2104a, 2104b, 2104c. Within the P-well 2110, between the center and left two isolation trenches 2104a and 2104b are NSD regions 2162a and 2162b, N-type regions 2134a and 2134b, P-type region 2132a and 2132b. Above the substrate 2102 in the NMOS region 2103 is the source contact 2181, gate contact 2183 and drain contact 2185 of an NMOS transistor. In the quantum point contact device region 2104, is the drain contact 2131, the gate contact 2133 and the source contact 2135 for the quantum point contact device.

Illustrating the ability to create the quantum point contact device 2104 concurrently within a CMOS process along with the creation of an NMOS transistor, the P-well 2110 for the NMOS transistor 2102 and quantum point contact device 2104 is formed in the same process step. The P-type regions 2132b and 2132 are formed concurrently. Each of the structure types above the substrate 2102 can be formed concurrently for the NMOS, for PMOS transistors if included and for quantum point contact devices. It can be seen that by changing the conductivity types in portions of the pocket implants, and for the lightly doped drain and source/drain regions, a process for forming CMOS transistors can be used to form the novel quantum point contact device using existing implant materials and processes, so that the quantum point contact device is compatible with current semiconductor processes and tools, making fabrication of the quantum point contact devices cost effective and efficient.

Figure 22:
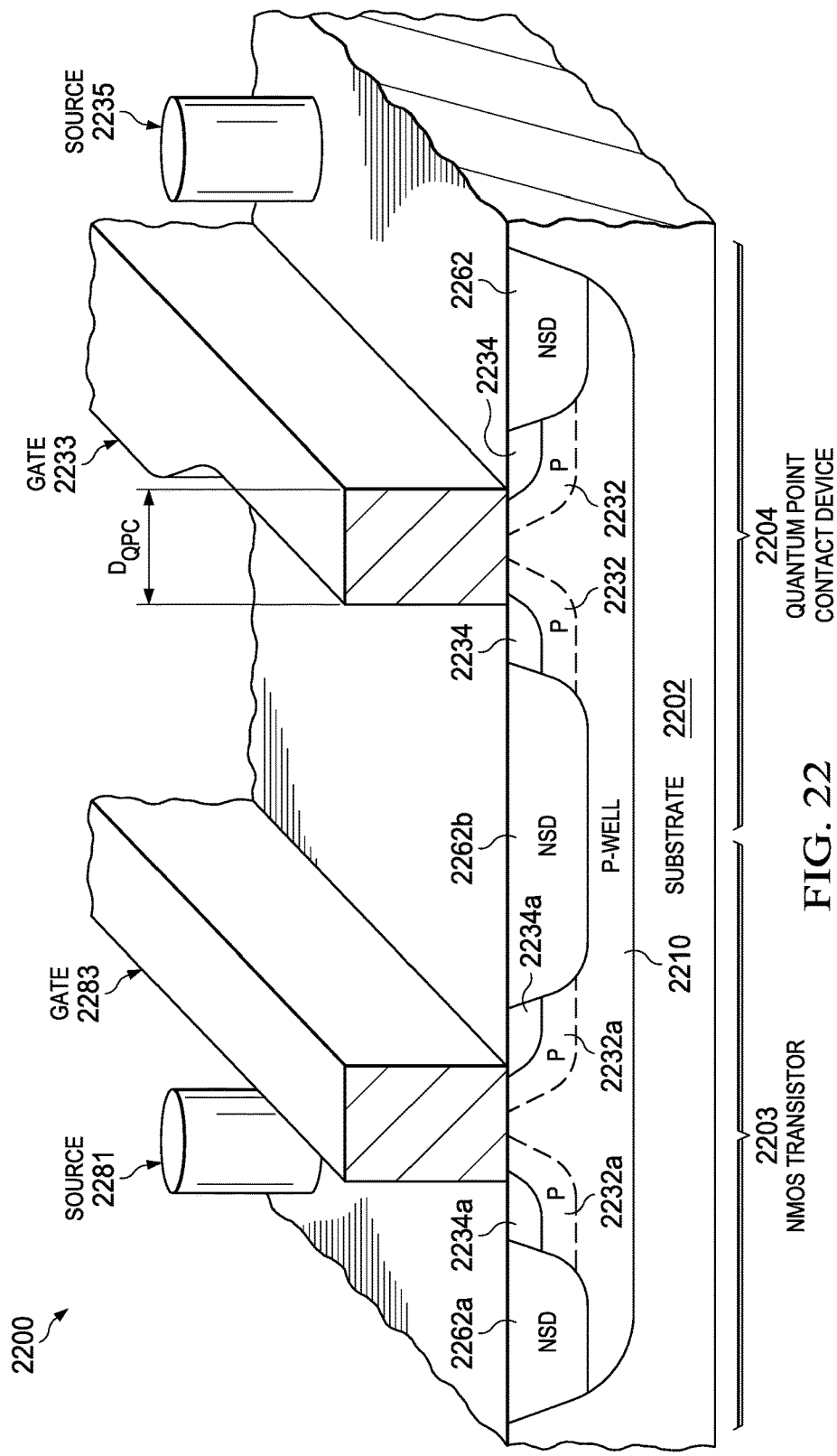
FIG. 22 depicts in a projection a quantum point contact device and a MOS transistor fabricated together on a substrate.

FIG. 22 depicts in a projection view 2200 a quantum point contact device 2204 fabricated in a P-well 2210 in a semiconductor substrate 2202 with an NMOS transistor 2203 formed simultaneously. For clarity of illustration, isolation structures are omitted in FIG. 22 but can be formed between the devices. IN FIG. 22, the NMOS transistor 2203 includes a gate 2283 overlying a channel region between a drain/source region 2262b and a source/drain region 2262a. Each of the drain/source and source/drain regions is formed of N-type source/drain implants. FIG. 22 also depicts quantum point contact device 2204 which includes a gate 2233, a source 2235, and a drain/source region 2162b, which in this example arrangement is common with the drain/source region of the NMOS transistor 2203, a source/drain region 2262, and a channel lying beneath the gate 2233 and between the LDD regions 2234.

The gate 2233 in FIG. 22 for the quantum point contact device is shown with a wide portion that is then narrowed to form a constriction area having a width $D_{QPC}$. This constriction area provides the quantum confinement needed to form the quantum point contact and can range in width from 5 to about 20 nanometers. In an example arrangement the distance $D_{QPC}$ is about 15 nanometers.

In operation, the quantum point contact device of FIG. 21 or 22 will form a resistance with levels of quantized conductance corresponding to the potential on the gate terminal, and each level is proportional to the gate potential on gate 2233 for example.

Figure 23:
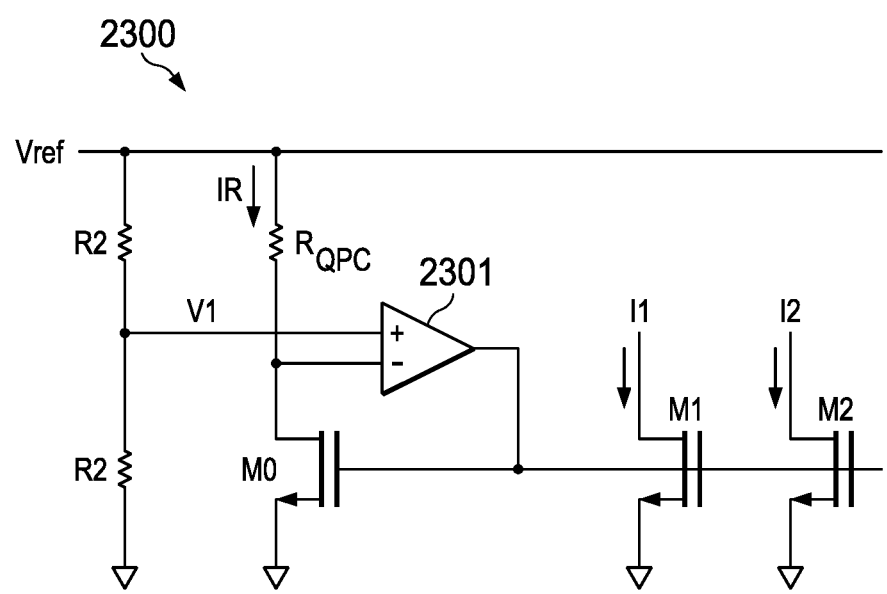
FIG. 23 depicts in a simplified circuit schematic a circuit application incorporating a resistor quantum point contact.

FIG. 23 depicts, in a simplified circuit schematic, an illustrative arrangement for a current source circuit 2300 incorporating a quantum point contact resistance $R_{QPC}$. In FIG. 23, a current source circuit is provided. A reference voltage Vref is divided across resistors R1 and R2 to provide a voltage V1 that, by reason of the voltage divider, will be equal to Vref*(R1/R1+R2). The op-amp 2301 is configured to compare the two voltages at the terminals and will adjust the voltage at the gate of transistor M0 to make them equal, producing a current IR through the quantum point contact resistance $R_{QPC}$. The value of this resistance will be proportional to the constants and as described above will be proportional to the quantity ⅓ kohm with the level set by the gate potential on the quantum device. The current IR will then be simply V1/$R_{QPC}$. The current IR is then output by current mirror devices transistors M1, M2 as currents I1, I2. If the transistors are matched, then IR=I1=I2. If the transistor sizes are ratioed, then I1, I2 can be proportionally related to IR. In sharp contrast to the current sources of the prior known approaches, use of the resistance $R_{QPC}$, which incorporates the quantum point contact device, produces currents I1, I2 that are independent of temperature and which will also be independent of process variations. Use of the novel arrangements of the present application in this example circuit therefore reduces the amount of circuitry needed to provide current sources for the remainder of the circuitry, and provides an accurate current that is fixed in value. The resistance $R_{QPC}$ can be used in a wide variety of application circuits, and the current source circuit of FIG. 23 is but one example of such a circuit arrangement that is provided to illustrate the use of the quantum point contact resistance.

Various modifications can also be made in the order of steps and in the number of steps to form additional novel arrangements that incorporate aspects of the present application, and these modifications will form additional alternative arrangements that are contemplated by the inventors as part of the present application and which fall within the scope of the appended claims.

Although the example illustrative arrangements have been described in detail, it should be understood that various changes, substitutions and alterations can be made herein without departing from the spirit and scope of the present application as defined by the appended claims.

Moreover, the scope of the present application is not intended to be limited to the particular illustrative example arrangement of the process, machine, manufacture, and composition of matter means, methods and steps described in this specification. As one of ordinary skill in the art will readily appreciate from the disclosure, processes, machines, manufacture, compositions of matter, means, methods or steps, presently existing or later to be developed, that perform substantially the same function or achieve substantially the same result as the corresponding example arrangements described herein may be utilized according to the illustrative arrangements presented and alternative arrangements described, suggested or disclosed. Accordingly, the appended claims are intended to include within their scope such processes, machines, manufacture, compositions of matter, means, methods, or steps.

What is claimed is:

1. A transistor device, comprising:
a semiconductor substrate having a surface;
a first region at and under the surface, the first region having a first conductivity type;
a gate structure above the surface and the first region, the gate structure having a first polygonal shape and a second polygonal shape overlapping each other only in a corner portion of each of the first polygonal shape and the second polygonal shape to define a quantum point between a first side of the pate structure and a second side of the gate structure that is opposite the first side;
a second region at and under the surface, aligned with the first side of the gate structure, having a first corner facing the quantum point, and having a second conductivity type opposite of the first conductivity type; and
a third region at and under the surface, aligned with the second side of the gate structure, having a second corner facing the quantum point, and having the second conductivity type.

2. The transistor device of claim 1, wherein the first corner and the second corner defines a path under the quantum point and diagonally across the first region.

3. The transistor device of claim 1, wherein the first side of the gate structure includes a first right angle aligning with the first corner of the second region, and the second side of the gate structure includes a second right angle aligning with the second corner of the third region.

4. The transistor device of claim 1, wherein the first conductivity type includes a P-type, and the second conductivity type includes an N-type.

5. The transistor device of claim 1, wherein the first conductivity type includes an N-type, and the second conductivity type includes a P-type.

6. The transistor device of claim 1, wherein:
the first polygonal shape includes a first rectangular shape having a first right angle; and
the second polygonal shape includes a second rectangular shape misaligned with the first polygonal shape and having a second right angle overlapping the first right angle to define the quantum point.

7. The transistor device of claim 1, further comprising:
first implants under and near the surface, and aligned with the first side of the gate structure along a width direction of the first region; and
second implants under and near the surface, and aligned with the second side of the gate structure along the width direction of the first region.

8. The transistor device of claim 7, wherein:
the first and second implants are each doped to the first conductivity type; and
one of the first implants is spaced apart from one of the second implants to define a width of the quantum point.

9. The transistor device of claim 7, wherein:
the first and second implants are each doped to the second conductivity type; and
one of the first implants connects with one of the second implants to define a width of the quantum point.

10. The transistor device of claim 1, further comprising:
a first lightly doped region extending from the second region to the first region, the first lightly doped region having a first doping concentration lower than the second region; and
a second lightly doped region extending from the third region to the first region, the second lightly doped region having a second doping concentration lower than the second region.

11. An integrated circuit, comprising:
a semiconductor substrate having a surface;
a metal oxide semiconductor (MOS) transistor along the surface; and a quantum point contact (QPC) device including:
a first region at and under the surface, the first region having a first conductivity type;
a gate structure above the surface and the first region, the gate structure having a first polygonal shape and a second polygonal shape overlapping each other only in a corner portion of each of the first polygonal shape and the second polygonal shape to define a quantum point between a first side of the gate structure and a second side of the gate structure that is opposite the first side;
a second region at and under the surface, aligned with the first side of the gate structure, having a first corner facing the quantum point, and having a second conductivity type opposite of the first conductivity type; and
a third region at and under the surface, aligned with the second side of the gate structure, having a second corner facing the quantum point, and having the second conductivity type.

12. The integrated circuit of claim 11, wherein the first corner and the second corner defines a path under the quantum point and diagonally across the first region.

13. The integrated circuit of claim 11, wherein the first side of the gate structure includes a first right angle aligning with the first corner of the second region, and the second side of the gate structure includes a second right angle aligning with the second corner of the third region.

14. The integrated circuit of claim 11, wherein the first conductivity type includes a P-type, and the second conductivity type includes an N-type.

15. The integrated circuit of claim 11, wherein the first conductivity type includes an N-type, and the second conductivity type includes a P-type.

16. The integrated circuit of claim 11, wherein:
the first polygonal shape includes a first rectangular shape having a first right angle; and
the second polygonal shape includes a second rectangular shape misaligned with the first polygonal shape and having a second right angle overlapping the first right angle to define the quantum point.

17. The integrated circuit of claim 11, wherein the QPC device includes:
first implants under and near the surface, and aligned with the first side of the gate structure along a width direction of the first region; and
second implants under and near the surface, and aligned with the second side of the gate structure along the width direction of the first region.

18. The integrated circuit of claim 17, wherein:
the first and second implants are each doped to the first conductivity type; and
one of the first implants is spaced apart from one of the second implants to define a width of the quantum point.

19. The integrated circuit of claim 17, wherein:
the first and second implants are each doped to the second conductivity type; and
one of the first implants connects with one of the second implants to define a width of the quantum point.

20. The integrated circuit of claim 11, wherein the QPC device includes:
a first lightly doped region extending from the second region to the first region, the first lightly doped region having a first doping concentration lower than the second region; and
a second lightly doped region extending from the third region to the first region, the second lightly doped region having a second doping concentration lower than the second region.

* * * * *